(12) United States Patent
Wang

(10) Patent No.: US 12,288,718 B2
(45) Date of Patent: Apr. 29, 2025

(54) SEPARATING DEVICE AND METHOD OF SEPARATION

(71) Applicant: Shenzhen China Star Optoelectronics Semiconductor Display Technology Co., Ltd., Guangdong (CN)

(72) Inventor: Kaijun Wang, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 877 days.

(21) Appl. No.: 17/417,786

(22) PCT Filed: Dec. 30, 2020

(86) PCT No.: PCT/CN2020/141224
§ 371 (c)(1),
(2) Date: Jun. 24, 2021

(87) PCT Pub. No.: WO2021/232815
PCT Pub. Date: Nov. 25, 2021

(65) Prior Publication Data
US 2022/0344208 A1      Oct. 27, 2022

(30) Foreign Application Priority Data

May 22, 2020   (CN) .................... 202010440436.8

(51) Int. Cl.
*H01L 21/78*  (2006.01)
*H01L 21/67*  (2006.01)
*H01L 21/683*  (2006.01)

(52) U.S. Cl.
CPC .... *H01L 21/7813* (2013.01); *H01L 21/67092* (2013.01); *H01L 21/6835* (2013.01)

(58) Field of Classification Search
CPC .......... H01L 21/7813; H01L 21/67092; H01L 21/6835; H01L 2221/68381; H01L 21/6838

See application file for complete search history.

(56) References Cited

U.S. PATENT DOCUMENTS

| 2009/0251879 | A1* | 10/2009 | Thompson ........ H01L 21/67092 438/118 |
| 2018/0093466 | A1 | 4/2018 | Park et al. |
| 2019/0022901 | A1 | 1/2019 | Tanaka et al. |

FOREIGN PATENT DOCUMENTS

| CN | 103219263 | 7/2013 |
| CN | 107914235 | 4/2018 |

(Continued)

*Primary Examiner* — George R Koch
*Assistant Examiner* — Christopher C Caillouet

(57) ABSTRACT

A separating device and a method of separation are disclosed. The separating device and the method of separation are for separating a flexible substrate fixed on a carrier substrate having a first divided area and a second divided area, the flexible substrate includes an effective area defined corresponding to the first divided area and an ineffective area defined corresponding to the second divided area. The separating device comprises: a movable platen, for raising the second divided area, thereby partially separating the carrier substrate from the flexible substrate, and thereby forming a slit; a separating sheet, for separating the flexible substrate along the slit, thereby separating the effective area of the flexible substrate from the first divided area of the carrier substrate; and a suction head, for removing the separated flexible substrate from the carrier substrate.

14 Claims, 7 Drawing Sheets

(56) References Cited

FOREIGN PATENT DOCUMENTS

| | | |
|---|---|---|
| CN | 108605397 | 9/2018 |
| CN | 111613555 | 9/2020 |
| JP | 2015-083504 | 4/2015 |

* cited by examiner

```
                    ┌─ S101
┌─────────────────────────────────────────────┐
│  Raising second divided area using movable platen,
│  thereby separating carrier substrate from flexible sub-
│       strate, and thereby forming an opening
└─────────────────────────────────────────────┘
                       │
                       ▼         ┌─ S102
┌─────────────────────────────────────────────┐
│ Separating flexible substrate along opening using separat-
│  ing sheet, thereby separating effective area of flexible
│    substrate from first divided area of carrier substrate
└─────────────────────────────────────────────┘
                       │
                       ▼         ┌─ S103
┌─────────────────────────────────────────────┐
│  Removing separated flexible substrate from carrier sub-
│             strate using suction head
└─────────────────────────────────────────────┘
```

FIG. 4

SEPARATING DEVICE AND METHOD OF SEPARATION

RELATED APPLICATIONS

This application is a National Phase of PCT Patent Application No. PCT/CN2020/141224 having International filing date of Dec. 30, 2020, which claims the benefit of priority of Chinese Patent Application No. 202010440436.8 filed on May 22, 2020. The contents of the above applications are all incorporated by reference as if fully set forth herein in their entirety.

FIELD AND BACKGROUND OF THE INVENTION

The present disclosure relates to the technical field of display, and especially relates to a separating device and a method of separation.

With the development of display technology, flexible display devices are becoming more and more popular because of advantages, such as being thin and light, being easy to bend, and being easy to carry.

In production of the flexible display device, generally, a flexible substrate is glued onto a rigid carrier substrate before the flexible substrate undergoes related processing procedures. The flexible substrate that has gone through all of the procedures is then separated from the rigid carrier substrate, and the flexible display device is obtained.

In the separation process described above, generally, mechanical equipments are used to directly suction the rigid carrier substrate, and to remove the carrier substrate by applying a certain amount of force. This process pulls the flexible substrate, and thus causes damage.

SUMMARY OF THE INVENTION

Technical Problem

The present disclosure is aimed to provide a separating device and a method of separation that can enhance a yield rate of the flexible substrate.

Solution to the Problem

Technical Solution

The embodiments of the present disclosure provide a separating device for separating a flexible substrate fixed on a carrier substrate having a first divided area and a second divided area distinguished from each other, the flexible substrate includes an effective area and an ineffective area, wherein the first divided area is defined corresponding to the effective area, and the second divided area is defined corresponding to the ineffective area, the separating device comprises:

a movable platen, for raising the second divided area, thereby partially separating the carrier substrate from the flexible substrate, and thereby forming a slit;

a sensor disposed on a separating sheet, for detecting changes of light at the slit, thereby generating control signals;

the separating sheet for separating the flexible substrate along the slit according to the control signals, thereby separating the effective area of the flexible substrate from the first divided area of the carrier substrate; and a suction head, for removing the separated flexible substrate from the carrier substrate.

In an embodiment, the separating device further comprises: a fixed platen disposed adjacent to the movable platen, for carrying the first divided area of the carrier substrate and the effective area of the flexible substrate.

In an embodiment, the separating device further comprises: a rotating component connecting the fixed platen and the movable platen, for controlling the movable platen to rotate around the fixed platen, thereby raising the second divided area of the carrier substrate.

In an embodiment, the rotating component includes shafts or hinges.

In an embodiment, the separating device further comprises: a control unit, for controlling a rotation rate and a rotation extent of the rotating component.

In an embodiment, the separating device further comprises: a cutting component, for cutting the carrier substrate according to a spatial relationship between the effective area and the ineffective area of the flexible substrate, thereby forming the first divided area defined corresponding to the effective area and the second divided area defined corresponding to the ineffective area from the carrier substrate;

the cutting component is also used for, after the separated flexible substrate is removed from the carrier substrate, cutting off the ineffective area of the removed flexible substrate.

The embodiments of the present disclosure also provide a method of separation, for separating a flexible substrate fixed on a carrier substrate having a first divided area and a second divided area, wherein the first divided area is defined corresponding to an effective area of the flexible substrate, and the second divided area is defined corresponding to an ineffective area of the flexible substrate, the method of separation comprises steps of:

raising the second divided area using a movable platen, thereby partially separating the carrier substrate from the flexible substrate, and thereby forming a slit;

separating the flexible substrate along the slit using a separating sheet, thereby separating the effective area of the flexible substrate from the first divided area of the carrier substrate; and removing the separated flexible substrate from the carrier substrate using a suction head.

In an embodiment, the method further comprises step of: cutting the carrier substrate according to a spatial relationship between the effective area and the ineffective area of the flexible substrate using a cutting component, thereby forming the first divided area defined corresponding to the effective area and the second divided area defined corresponding to the ineffective area from the carrier substrate, before the step of raising the second divided area using the movable platen, thereby separating an area in the first divided area, which is close to the dividing zone, from the flexible substrate, and thereby forming the slit.

In an embodiment, the method comprises: the flexible substrate and the carrier substrate are fixed by a glue layer;

wherein the step of cutting the carrier substrate according to the spatial relationship between the effective area and the ineffective area of the flexible substrate using the cutting component, thereby forming the first divided area defined corresponding to the effective area and the second divided area defined corresponding to the ineffective area from the carrier substrate includes: cutting the carrier substrate and the glue layer according to the spatial relationship between the effective area and the ineffective area of the flexible substrate using the cutting component, thereby dividing the carrier substrate into the first divided area and the second divided area, and dividing the glue layer into a first glue layer part and a second glue layer part, wherein the first glue layer part corresponds to the first divided area, and the second glue layer part corresponds to the second divided area;

wherein the step of raising the second divided area using the movable platen, thereby separating the area in the first divided area, which is close to the dividing zone, from the flexible substrate, and thereby forming the slit includes: raising the second divided area and the second glue layer part using the movable platen, thereby partially separating the flexible substrate from the first glue layer part, and thereby forming the slit.

The embodiments of the present disclosure further provide a separating device for separating a flexible substrate fixed on a carrier substrate having a first divided area and a second divided area distinguished from each other, the flexible substrate includes an effective area and an ineffective area, wherein the first divided area is defined corresponding to the effective area, and the second divided area is defined corresponding to the ineffective area, the separating device comprises:

a movable platen, for raising the second divided area, thereby partially separating the carrier substrate from the flexible substrate, and thereby forming a slit;

a separating sheet, for separating the flexible substrate along the slit, thereby separating the effective area of the flexible substrate from the first divided area of the carrier substrate; and a suction head, for removing the separated flexible substrate from the carrier substrate.

In an embodiment, the separating device further comprises: a fixed platen disposed adjacent to the movable platen, for carrying the first divided area of the carrier substrate and the effective area of the flexible substrate.

In an embodiment, the separating device further comprises: a rotating component connecting the fixed platen and the movable platen, for controlling the movable platen to rotate around the fixed platen, thereby raising the second divided area of the carrier substrate.

In an embodiment, the rotating component includes shafts or hinges.

In an embodiment, the separating device further comprises: a control unit, for controlling a rotation rate and a rotation extent of the rotating component.

In an embodiment, the separating device further comprises: a cutting component, for cutting the carrier substrate according to a spatial relationship between the effective area and the ineffective area of the flexible substrate, thereby forming the first divided area defined corresponding to the effective area and the second divided area defined corresponding to the ineffective area from the carrier substrate;

the cutting component is also used for, after the separated flexible substrate is removed from the carrier substrate, cutting off the ineffective area of the removed flexible substrate.

Beneficial Effect of the Invention:
Beneficial Effect:

By forming the slit between the carrier substrate and the flexible substrate using the movable platen, separating the flexible substrate along the slit using the separating sheet, and then removing the separated flexible substrate from the carrier substrate using the suction head, the separating device and the method of separation according to the embodiments of the present disclosure avoid the pulling damage caused by directly suctioning the flexible substrate using the suction head, and thereby enhancing the yield rate of the flexible substrate.

BRIEF DESCRIPTION OF THE SEVERAL VIEWS OF THE DRAWINGS

The technical solution of the present disclosure and other advantageous effects will be apparent through the following detailed description of specific embodiments of the disclosure taken in conjunction with the accompanying drawings.

FIG. 4 is a schematic flow chart of a method of separation provided by the embodiments of the present disclosure;

DESCRIPTION OF SPECIFIC EMBODIMENTS OF THE INVENTION

Figure 1:
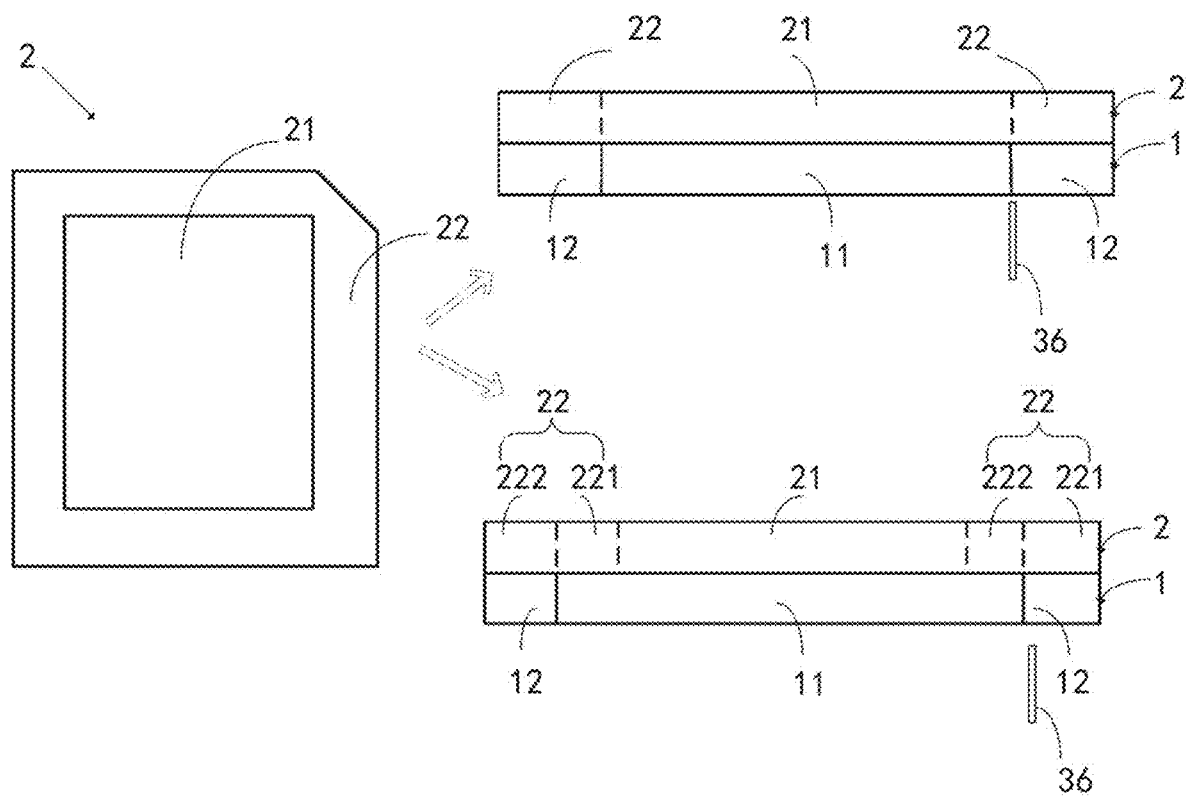
FIG. 1 is a schematic view of a cutting operation executed by a cutting component of a separation device provided by the embodiments of the present disclosure.

The technical solutions in the embodiments of the present disclosure are clearly and completely described as follows with reference to the accompanying drawings in the embodiments. It is apparent that the described embodiments are only a part of the embodiments of the present disclosure, and not all of the embodiments. All other embodiments obtained by a person skilled in the art based on the embodiments of the present disclosure without inventive efforts are within the scope of the present disclosure.

In the description of the present disclosure, it is to be understood that the oriental and the positional relationships of the terms "center", "longitudinal", "transverse", "length", "width", "thickness", "upper", "lower", "front", "rear", "left", "right", "vertical", "horizontal", "top", "bottom", "inside", "outside", "clockwise", "counterclockwise", etc. are based upon the oriental or positional relationship shown in the drawings, are merely for facilitating and simplifying the description of the present disclosure, and do not indicate or imply that the device or components referred to have a specific orientation, and are constructed and operated in a specific orientation. Therefore, it should not be construed as limiting the disclosure. Moreover, the terms "first" and "second" are used for descriptive purposes only and are not to be construed as indicating or implying a relative importance or implicitly indicating the number of indicated technical features. Thus, features defining "first" or "second" may include one or more of the described features either explicitly or implicitly. In the description of the present disclosure, the meaning of "a plurality of" is two or more unless specifically defined otherwise.

In the present disclosure, it is noted that, unless otherwise explicitly set forth and defined, the terms "mount", "contact", and "connect" should be understood broadly, for example, as a fixed connection or a removable connection, an integral connection, a mechanical connection, an electrical connection, a communication with each other, a direct connection, an indirect connection via intermediate medium, an internal communication between two elements, or an inter-reaction relationship between two elements. The specific meaning of the above-mentioned terms in the present disclosure may be understood by a person of ordinary skill in the art in light of specific circumstances.

In the present disclosure, unless otherwise expressly stated and defined, the description that "a first feature is on or under a second feature" may mean that the first feature directly contacts the second feature, or mean that the first feature contacts the second feature via another feature therebetween, rather than directly contact the second feature. Moreover, the description that "the first feature is on/above/over the second feature" may mean that the first feature is directly or obliquely on/above/over the second feature, or just mean the horizontal height of the first feature is higher than that of the second feature. The description that "the first feature is under/below/beneath the second feature" may mean that the first feature is directly or obliquely under/below/beneath the second feature, or just mean the horizontal height of the first feature is lower than that of the second feature.

The following description provides a number of different embodiments or examples for implementing the different structures of the present disclosure. In order to simplify the present disclosure, components and arrangements of specific examples are described below. Certainly, the examples are merely exemplary and are not intended to limit the present disclosure. In addition, for the sake of simplicity and clarity, the reference numerals and/or the reference letters may repeat in different examples in the present disclosure, which does not indicate the relationship between the various discussed embodiments and/or arrangements. Moreover, the examples of various specific processes and materials are provided in the present disclosure, but a person of ordinary skill in the art will appreciate the application of other processes and/or the use of other materials.

The embodiments of the present disclosure provide a separating device for separating a flexible substrate fixed on a carrier substrate.

As shown in FIG. 1, the flexible substrate 2 has an effective area 21 and an ineffective area 22. Specifically, the flexible substrate 2 may be glued or be deposited onto the carrier substrate 1 for further processing. The flexible substrate 2 can include constitutions such as ultra-thin glass, stainless steel sheet, and polymer film. After all processing procedures are completed, the flexible substrate 2 needs to be separated from the carrier substrate 1. Because the flexible substrate 2 is flexible, separating the flexible substrate 2 by applying force directly causes pulling damage to the flexible substrate 2.

As shown in FIG. 1, the separating device 3 comprises a cutting component 36. First, the cutting component 36 is used to cut the carrier substrate 1 according to a spatial relationship between the effective area 21 and the ineffective area 22 of the flexible substrate 2.

In an embodiment, a first divided area 11 defined corresponding to the effective area 21, and a second divided area 12 defined corresponding to the ineffective area 22 can be formed from the carrier substrate 1 by using the cutting component 36.

In an embodiment, the ineffective area 22 can be further divided into a first area 221 and a second area 222. The first area 221 is a part of the ineffective area 22 which is close to the effective area 21, and the second area 222 is a part of the ineffective area 22 which is far from the effective area 21. Then the carrier substrate 1 is cut into the first divided area 11 and the second divided area 12 by using the cutting component 36. The first divided area 11 is defined corresponding to the effective area 21 and also to the first area 221, and the second divided area 12 is defined corresponding to the second area 222.

Figure 2:
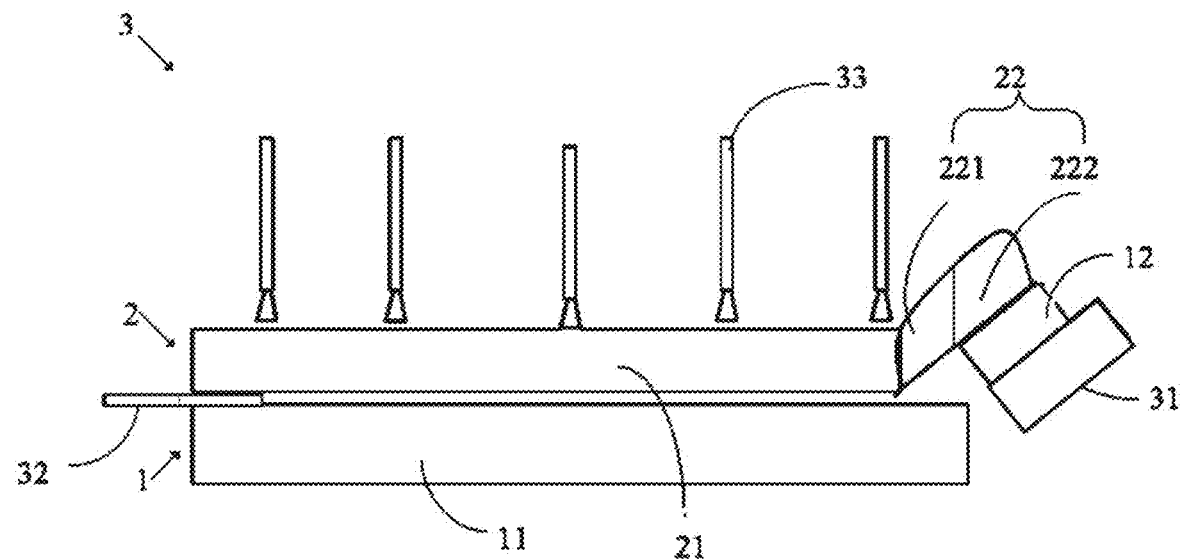
FIG. 2 is a first structural schematic view of the separating device provided by the embodiments of the present disclosure.

As shown in FIG. 2, the separating device 3 comprises a movable platen 31, a separating sheet 32, and a suction head 33. The movable platen 31 is for raising the second divided area 12, thereby partially separating the carrier substrate 1 from the flexible substrate 2, and thereby forming a slit. It should be noted that, the movable platen 31 can be bent upward or downward.

In an embodiment, if the first divided area 11 is defined corresponding to the effective area 21 of the flexible substrate 2, and the second divided area 12 is defined corresponding to the ineffective area 22 of the flexible substrate 2, then when the movable platen 31 raises the second divided area 12, an area in the effective area 21, which is close to the ineffective area 22, is separated from the first divided area 11, thereby forming the slit.

In an embodiment, if the ineffective area 22 is divided into the first area 221 and the second area 222, the first divided area 11 is defined corresponding to the effective area 21 and to the first area 221, and the second divided area 12 is defined corresponding to the second area 222. Then when the movable platen 31 raises the second divided area 12, the first area 221 is separated from the first divided area 11, thereby forming the slit. Because the first area 221 belongs to the ineffective area 22, deformation of the effective area 21 that occurs in the process of forming the slit by raising the second divided area 12 may be avoided.

Figure 3:
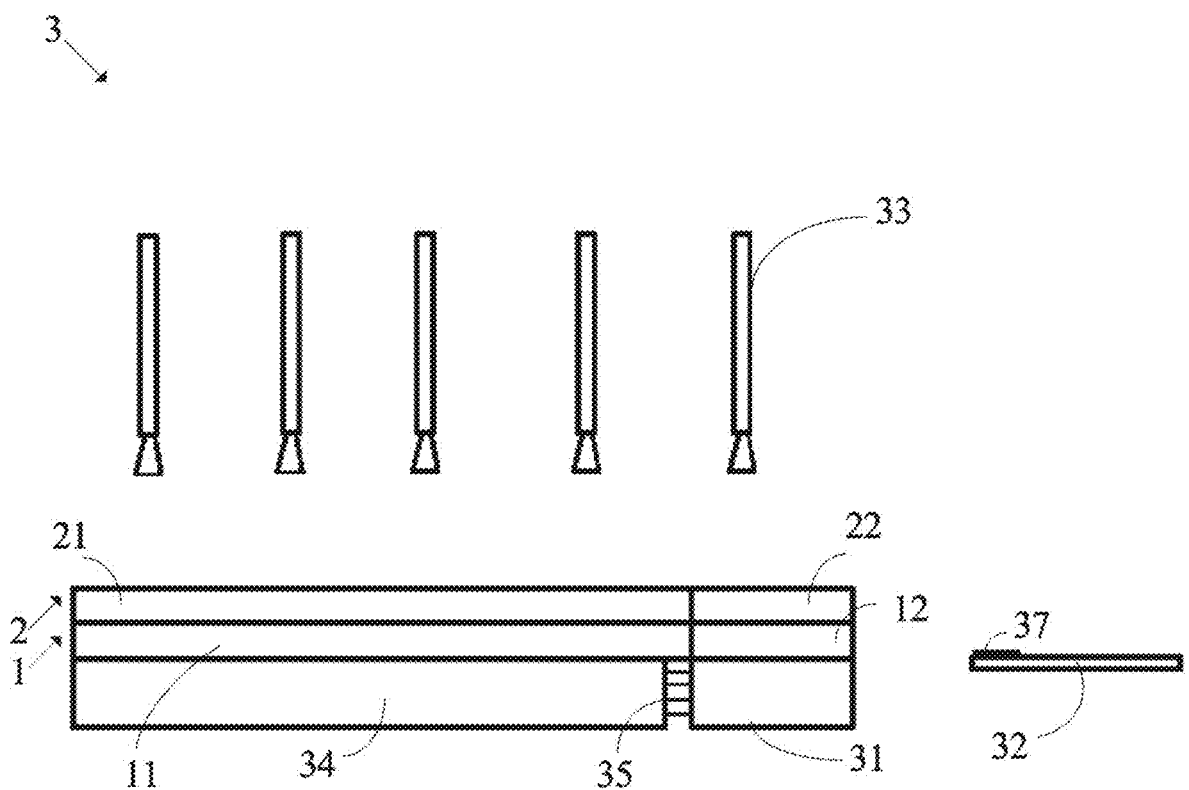
FIG. 3 is a second structural schematic view of the separating device provided by the embodiments of the present disclosure.

Further, as shown in FIG. 3, the separating device 3 further comprises: a fixed platen 34, which is disposed adjacent to the movable platen 31, and is for carrying the first divided area 11 of the carrier substrate 1 and the effective area 21 of the flexible substrate 2.

The separating device 3 further comprises: a rotating component 35, which connects the fixed platen 34 and the movable platen 31. The rotating component 35 is for controlling the movable platen 31 to rotate around the fixed platen 34, thereby raising the second divided area 12 of the carrier substrate 1. Wherein, the rotating component 35 includes shafts or hinges.

The separating device 3 further comprises a control unit for controlling rotation rate and rotation extent of the rotating component 35, so as to avoid the rotating rate or the rotation extent being too great, and thus damage the effective area 21 of the flexible substrate 2.

The separating sheet 32 is for separating the flexible substrate 2 along the slit, thereby separating the effective area 21 of the flexible substrate 2 from the first divided area 11 of the carrier substrate 1.

In an embodiment, the separating device 3 further comprises a sensor 37 disposed on the separating sheet 32. The sensor 37 can be a photoelectrical sensor. When the movable platen 31 raises the second divided area 12, a refractive index of light at the position where the carrier substrate 1 is separated from the flexible substrate 2 changes. That is, light at the slit changes. Therefore, the sensor 37 may be used for detecting the change of the light at the slit, thereby generating control signals. Then the separating sheet 32 separates the flexible substrate 2 along the slit according to the control signals. In addition, as the progression of the separation by the separating sheet 32, the sensor 37 can also instruct the separating sheet 32 for a direction of the separation, thereby improving accuracy of the separation.

The suction head 33 is for removing the separated flexible substrate 2 from the carrier substrate 1. In addition, the ineffective area 22 of the separated flexible substrate 2 may be cut off using cutting component 36.

By forming the slit between the carrier substrate and the flexible substrate using the movable platen, separating the flexible substrate along the slit using the separating sheet, and then removing the separated flexible substrate using the suction head, the separating device of the embodiments of the present disclosure enhances a yield rate of the flexible substrate.

The embodiments of the present disclosure also provide a method of separation for separating the flexible substrate fixed on the carrier substrate. As shown in FIG. 1, the flexible substrate 2 has the effective area 21 and the ineffective area 22. Specifically, the flexible substrate 2 may be deposited on the carrier substrate 1 for further processing. The flexible substrate 2 can include constitutions such as ultra-thin glass, stainless steel sheet, and polymer film. After all of the processing procedures are completed, the flexible substrate 2 needs to be separated from the carrier substrate 1. Because the flexible substrate 2 is flexible, separating the flexible substrate 2 by applying force directly causes pulling damage to the flexible substrate 2.

Refer to FIG. 4, which is a schematic flow chart of the method of separation provided by the embodiments of the present disclosure. Wherein, the method of separation comprises the following steps:

Step S101, raising the second divided area 12 using the movable platen 31, thereby partially separating the carrier substrate 1 from the flexible substrate 2, and thereby forming the slit.

In an embodiment, the method further comprises the following step: cutting the carrier substrate according to the spatial relationship between the effective area and the ineffective area of the flexible substrate using the cutting component, thereby forming the first divided area and the second divided area from the carrier substrate, before the step of raising the second divided area using the movable platen, thereby separating the carrier substrate from the flexible substrate, and thereby forming the slit.

Figure 5:
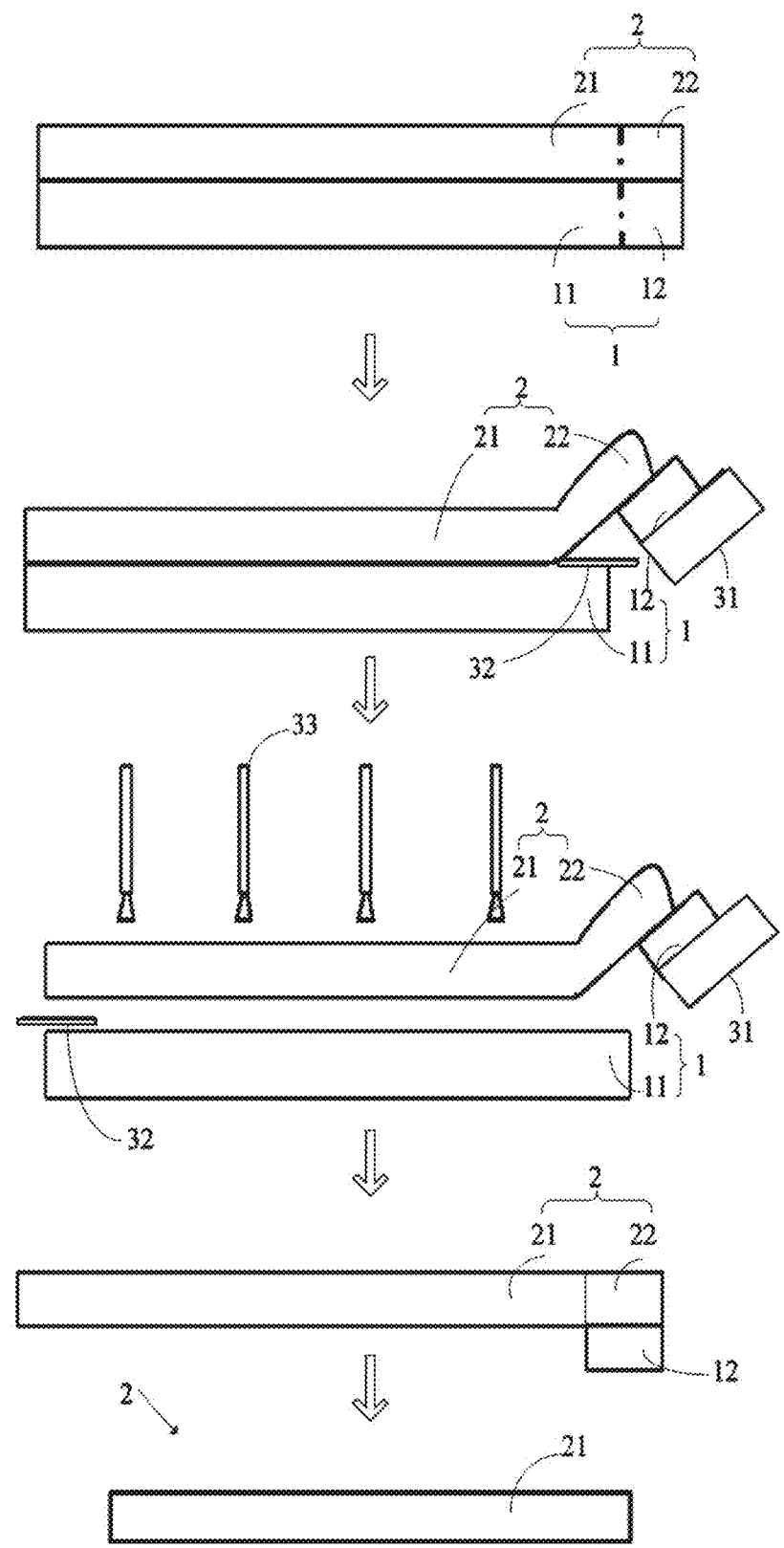
FIG. 5 is a schematic flow chart of a first scenario of the method of separation provided by the embodiments of the present disclosure.

As shown in FIG. 1 and in FIG. 5, the carrier substrate 1 can be directly cut into the first divided area 11 defined corresponding to the effective area 21, and the second divided area 12 defined corresponding to the ineffective area 22.

In an embodiment, the ineffective area 22 can be further divided into the first area 221 and the second area 222. The first area 221 is the part of the ineffective area 22 which is close to the effective area 21, and the second area 222 is the part of the ineffective area 22 which is far from the effective area 21. Then the carrier substrate 1 is cut into the first divided area 11 and the second divided area 12 using the cutting component 36. The first divided area 11 is defined corresponding to the effective area 21 and also to the first area 221, and the second divided area 12 is defined corresponding to the second area 222.

Then, as shown in FIG. 5, the second divided area 12 is raised by the movable platen 31, the carrier substrate 1 is thereby partially separated from the flexible substrate 2, and the slit is thereby formed. It should be noted that, the movable platen 31 can be bent upward or downward.

In an embodiment, if the first divided area 11 is defined corresponding to the effective area 21 of the flexible substrate 2, and the second divided area 12 is defined corresponding to the ineffective area 22 of the flexible substrate 2. Then when the movable platen 31 raises the second divided area 12, the area in the effective area 21, which is close to the ineffective area 22, is separated from the first divided area 11, thereby forming the slit.

In an embodiment, if the ineffective area 22 is divided into the first area 221 and the second area 222, the first divided area 11 is defined corresponding to the effective area 21 and to the first area 221, and the second divided area 12 is defined corresponding to the second area 222. Then when the movable platen 31 raises the second divided area 12, the first area 221 is separated from the first divided area 11, thereby forming the slit. Because the first area 221 belongs to the ineffective area 22, deformation of the effective area 21 that occurs in the process of forming the slit by raising the second divided area 12 may be avoided.

Step S102, separating the flexible substrate 2 along the slit using the separating sheet 32, thereby separating the effective area 21 of the flexible substrate 2 from the first divided area 11 of the carrier substrate 1.

As shown in FIG. 5, the separating sheet 32 separates the flexible substrate 2 along the slit, thereby separating the effective area 21 of the flexible substrate 2 from the first divided area 11 of the carrier substrate 1.

In an embodiment, the sensor 37 may be disposed on the separating sheet 32. The sensor 37 can be the photoelectrical sensor. When the separating sheet 32 raises the second divided area 12, the refractive index of the light at the position where the carrier substrate 1 is separated from the flexible substrate 2 changes. That is, the light at the slit changes. Therefore, the sensor 37 may be used for detecting the change of the light at the slit, thereby generating the control signals. Then the separating sheet 32 separates the flexible substrate 2 along the slit according to the control signals. In addition, as the progression of the separation by the separating sheet 32, the sensor 37 can also instructs the separating sheet 32 for the direction of the separation, thereby improving the accuracy of the separation.

Step S103, removing the separated flexible substrate 2 from the carrier substrate 1 using the suction head 33.

As shown in FIG. 5, the separated flexible substrate 2 is sucked up by the suction head 33 and is removed from the carrier substrate 1.

Further, the ineffective area 22 of the separated flexible substrate 2 can be cut off using the cutting component 36, so as to obtain the flexible substrate 2 having the effective area 21.

Figure 6:
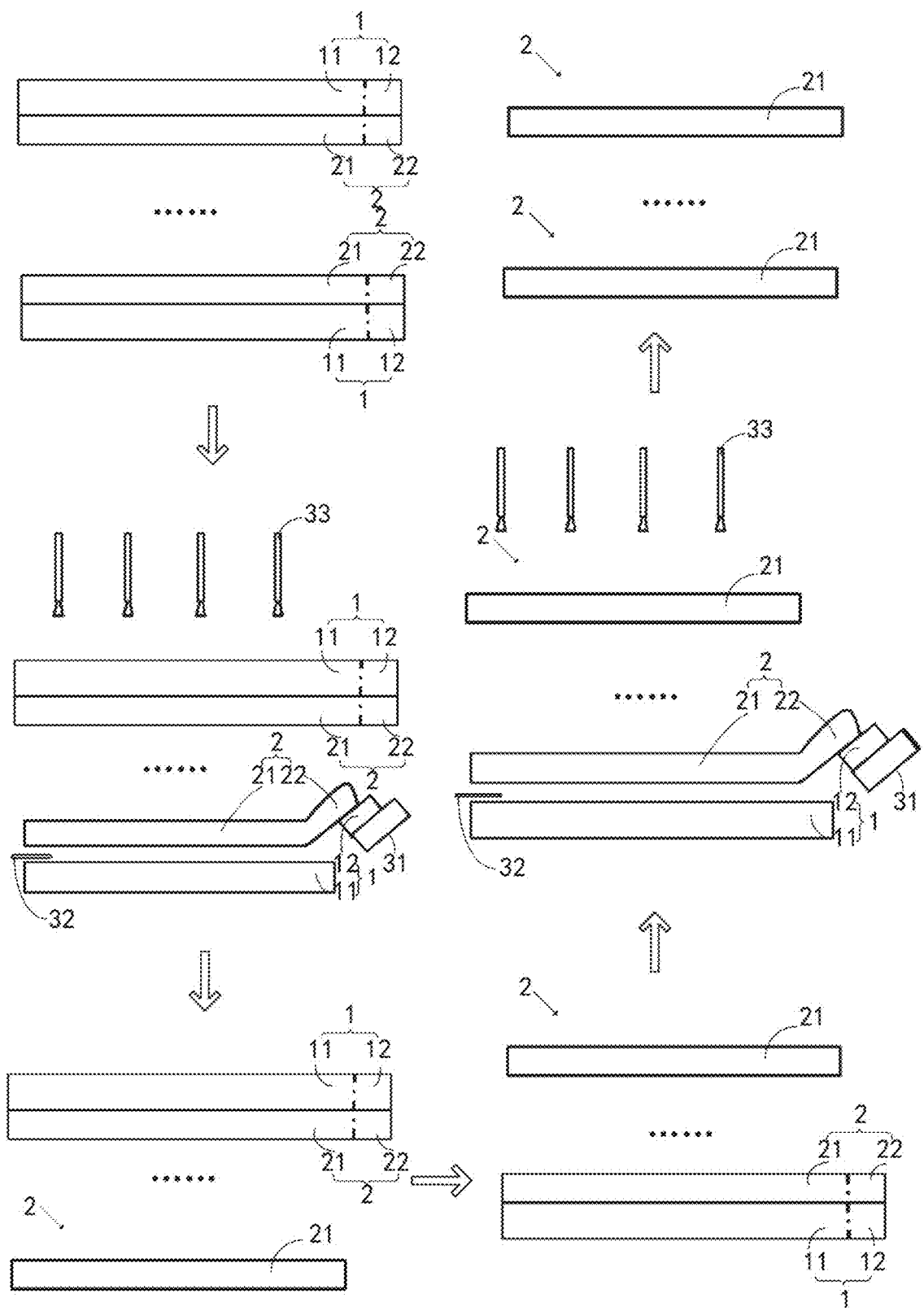
FIG. 6 is a schematic flow chart of a second scenario of the method of separation provided by the embodiments of the present disclosure.

It is noted that the flexible substrate described above may be a flexible substrate in an array-substrate-side of a display panel, or the flexible substrate may be a flexible substrate in a color-filter-substrate-side. As shown in FIG. 6, when both sides of the display panel are provided with the flexible substrate 2 and the carrier substrate 1, the two flexible substrates 2 are disposed opposite each other, and each of the two carrier substrates 1 is disposed on a side its respective corresponding flexible substrate 2 away from the other flexible substrate 2.

In order to remove both flexible substrates 2 from their respective carrier substrate 1, by using the aforementioned method of separation, the flexible substrate 2 on one side of the carrier substrate 1 is removed from the carrier substrate 1. The display panel is then flipped, so as to make the flexible substrate 2 of the other side on the top of the carrier substrate 1. The same operation is carried out again, which is not specifically described herein.

Figure 7:
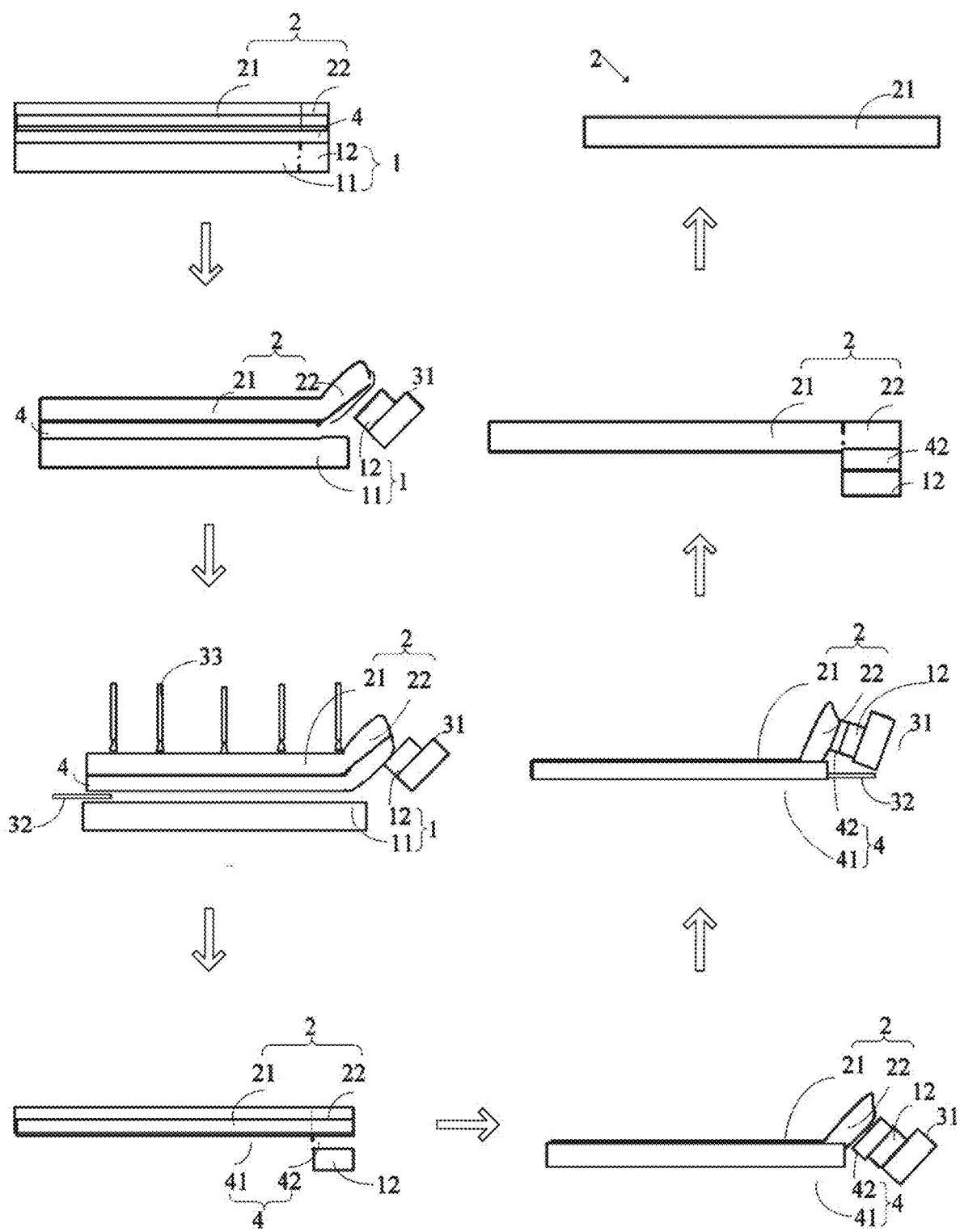
FIG. 7 is a schematic flow chart of a third scenario of the method of separation provided by the embodiments of the present disclosure.

The embodiments of the present disclosure also provide another method of separation for separating the flexible substrate fixed on the carrier substrate. As shown in FIG. 7, the flexible substrate 2 has the effective area 21 and the ineffective area 22. Wherein, the flexible substrate 2 may be glued onto the carrier substrate 1 using a glue. That is, there is a glue layer 4 between the flexible substrate 2 and the carrier substrate 1.

In an embodiment, as shown in FIG. 7, as described above, the carrier substrate 1 can be cut into the first divided area 11 and the second divided area 12 according to the spatial relationship between the effective area 21 and the ineffective area 22 of the flexible substrate 2, by cutting the carrier substrate 1 using the cutting component 36.

Then the movable platen 31 is used to raise the second divided area 12, thereby partially separating the glue layer 4 from the first divided area 11, and thereby forming the slit.

Then the separating sheet 32 is used to separate the glue layer 4 from the first divided area 11 along the slit, and the suction head 33 is used to suction the flexible substrate 2 from the side close to the flexible substrate 2, thereby removing the glue layer 4 and the flexible substrate 2 from the carrier substrate 1.

As described above, the glue layer 4 is cut according to the spatial relationship between the effective area 21 and the ineffective area 22 of the flexible substrate 2, thereby cutting the glue layer 4 into a first glue layer part 41 and a second glue layer part 42. The movable platen 31 is used to raise the second divided area 12, thereby partially separating the flexible substrate 2 from the first glue layer part 41, and thereby forming a new slit. Then the separating sheet 32 is used to separate the flexible substrate 2 from the first glue layer part 41 along the new slit. After the separation, the suction head 33 is used to suction the flexible substrate 2 from the side close to the flexible substrate 2, thereby removing the glue layer 4 and the flexible substrate 2 from the carrier substrate 1.

Finally, the ineffective area 22 of the flexible substrate 2 is cut off, leaving the flexible substrate 2 having the effective area 21.

Figure 8:
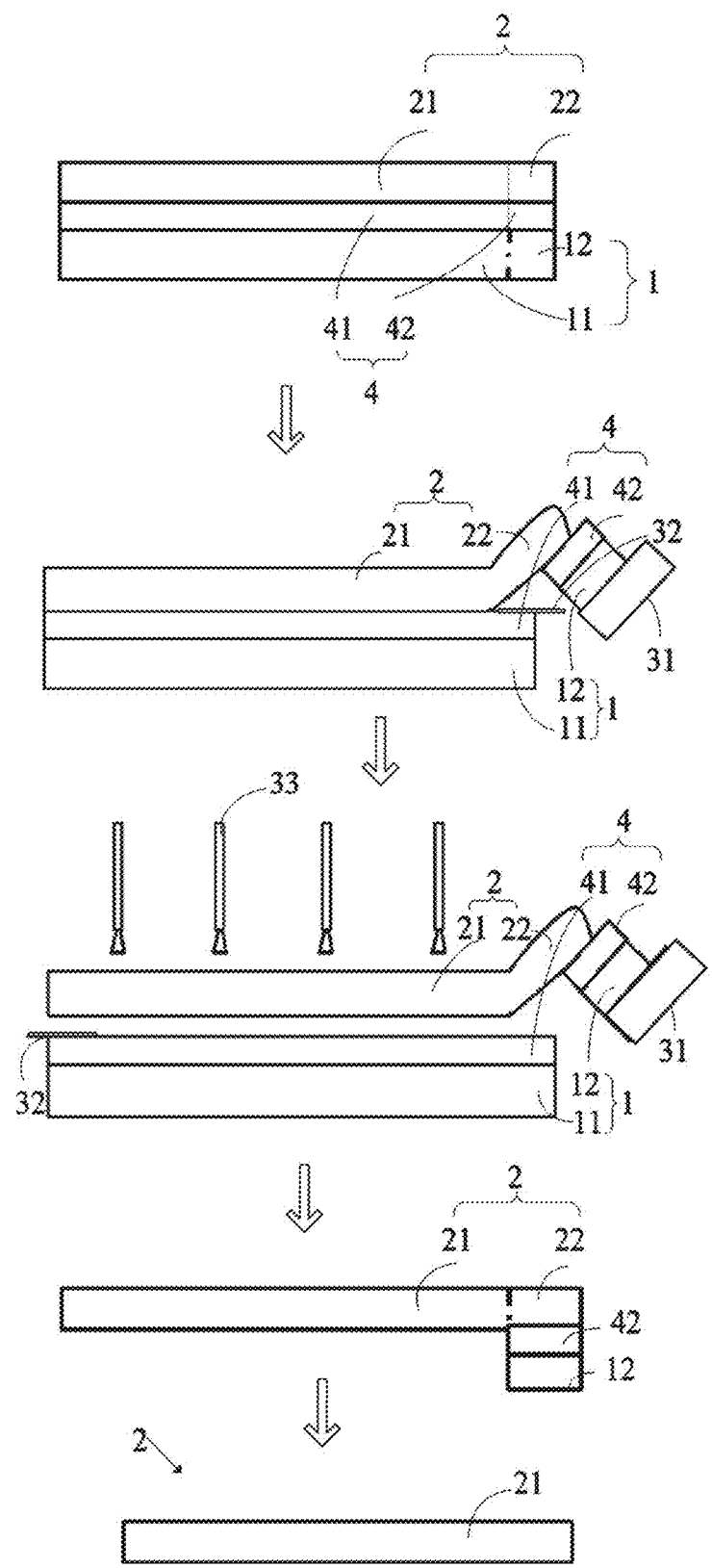
FIG. 8 is a schematic flow chart of a fourth scenario of the method of separation provided by the embodiments of the present disclosure.

In an embodiment, as shown in FIG. 8, the carrier substrate 1 and the glue layer 4 can also be cut according to the spatial relationship between the effective area 21 and the ineffective area 22 of the flexible substrate 2 using the cutting component 36, thereby cutting the carrier substrate 1 into the first divided area 11 and the second divided area 12, and thereby cutting the glue layer 4 into the first glue layer part 41 and the second glue layer part 42. Wherein, the first glue layer part 41 is defined corresponding to the first divided area 11, and the second glue layer part 42 is defined corresponding to the second divided area 12.

The second divided area 12 and the second glue layer part 42 are raised by the movable platen 31, so as to partially separate the flexible substrate 2 from the first glue layer part 41, and to form the slit.

Then the separating sheet 32 is used to separate the flexible substrate 2 from the first glue layer part 41 along the slit. Then the suction head 33 is used to suction from a side close to the flexible substrate 2, thereby removing the flexible substrate 2 from the first glue layer part 41.

Finally, the ineffective area 22 of the flexible substrate 2 is cut off using the cutting component 36, thereby obtaining the flexible substrate 2 having the effective area 21.

By forming the slit between the carrier substrate and the flexible substrate using the movable platen, separating the flexible substrate along the slit using the separating sheet, and then removing the separated flexible substrate from the carrier substrate using the suction head, the method of separation according to the embodiments of the present disclosure avoids the pulling damage caused by directly suctioning the flexible substrate using the suction head, and thereby enhancing the yield rate of the flexible substrate.

In the embodiments described hereinabove, the description of each embodiment has its own emphasis. For a part that is not detailed in an embodiment, refer to related descriptions in other embodiments.

The separating device and the method of separation provided in the embodiments of the present disclosure are described in detail above. Specific embodiments are used herein to explain the principles and implementation of the present disclosure. The above embodiments are used to assist in understanding the technical solutions and the core ideas of this disclosure. Those of ordinary skill in the art should understand that the technical solutions described in the foregoing embodiments can be modified, or some of the technical features can be replaced. These modifications and replacements do not substantially deviate the corresponding technical solutions from the scopes of the technical solutions of the embodiments of the present disclosure.

What is claimed is:

1. A separating device for separating a flexible substrate fixed on a carrier substrate having a first divided area and a second divided area distinguished from each other, the flexible substrate includes an effective area and an ineffective area, wherein the first divided area is defined corresponding to the effective area, and the second divided area is defined corresponding to the ineffective area, the separating device comprises:
    a movable platen, for raising the second divided area, thereby partially separating the carrier substrate from the flexible substrate, and thereby forming a slit;
    a sensor disposed on a separating sheet, for detecting changes of light at the slit, thereby generating control signals;
    the separating sheet for separating the flexible substrate along the slit according to the control signals, thereby separating the effective area of the flexible substrate from the first divided area of the carrier substrate; and
    a suction head, for removing the separated flexible substrate from the carrier substrate.

2. The separating device as claimed in claim 1, further comprising: a fixed platen disposed adjacent to the movable platen, for carrying the first divided area of the carrier substrate and the effective area of the flexible substrate.

3. The separating device as claimed in claim 2, further comprising: a rotating component connecting the fixed platen and the movable platen, for controlling the movable platen to rotate around the fixed platen, thereby raising the second divided area of the carrier substrate.

4. The separating device as claimed in claim 3, wherein the rotating component includes shafts or hinges.

5. The separating device as claimed in claim 1, further comprising: a control unit, for controlling a rotation rate and a rotation extent of the rotating component.

6. The separating device as claimed in claim 1, further comprising: a cutting component, for cutting the carrier substrate according to a spatial relationship between the effective area and the ineffective area of the flexible substrate, thereby forming the first divided area defined corresponding to the effective area and the second divided area defined corresponding to the ineffective area from the carrier substrate;

the cutting component is also used for, after the separated flexible substrate is removed from the carrier substrate, cutting off the ineffective area of the removed flexible substrate.

7. A method of separation, for separating a flexible substrate fixed on a carrier substrate having a first divided area and a second divided area, wherein the first divided area is defined corresponding to an effective area of the flexible substrate, and the second divided area is defined corresponding to an ineffective area of the flexible substrate, the method of separation comprises steps of:

raising the second divided area using a movable platen, thereby partially separating the carrier substrate from the flexible substrate, and thereby forming a slit;

detecting changes of light at the slit by disposing a sensor on a separating sheet, thereby generating control signals;

separating the flexible substrate along the slit using a separating sheet, thereby separating the effective area of the flexible substrate from the first divided area of the carrier substrate; and removing the separated flexible substrate from the carrier substrate using a suction head.

8. The method of separation as claimed in claim 7, further comprising step of: cutting the carrier substrate according to a spatial relationship between the effective area and the ineffective area of the flexible substrate using a cutting component, thereby forming the first divided area defined corresponding to the effective area and the second divided area defined corresponding to the ineffective area from the carrier substrate, before the step of raising the second divided area using the movable platen, thereby separating an area in the first divided area, which is close to the dividing zone, from the flexible substrate, and thereby forming the slit.

9. The method of separation as claimed in claim 7, wherein the flexible substrate and the carrier substrate are fixed by a glue layer;

wherein the step of cutting the carrier substrate according to the spatial relationship between the effective area and the ineffective area of the flexible substrate using the cutting component, thereby forming the first divided area defined corresponding to the effective area and the second divided area defined corresponding to the ineffective area from the carrier substrate includes: cutting the carrier substrate and the glue layer according to the spatial relationship between the effective area and the ineffective area of the flexible substrate using the cutting component, thereby dividing the carrier substrate into the first divided area and the second divided area, and dividing the glue layer into a first glue layer part and a second glue layer part, wherein the first glue layer part corresponds to the first divided area, and the second glue layer part corresponds to the second divided area;

wherein the step of raising the second divided area using the movable platen, thereby separating the area in the first divided area, which is close to the dividing zone, from the flexible substrate, and thereby forming the slit includes: raising the second divided area and the second glue layer part using the movable platen, thereby partially separating the flexible substrate from the first glue layer part, and thereby forming the slit.

10. A separating device for separating a flexible substrate fixed on a carrier substrate having a first divided area and a second divided area distinguished from each other, the flexible substrate includes an effective area and an ineffective area, wherein the first divided area is defined corresponding to the effective area, and the second divided area is defined corresponding to the ineffective area, the separating device comprises:

a movable platen, for raising the second divided area, thereby partially separating the carrier substrate from the flexible substrate, and thereby forming a slit;

a separating sheet, for separating the flexible substrate along the slit, thereby separating the effective area of the flexible substrate from the first divided area of the carrier substrate;

a suction head, for removing the separated flexible substrate from the carrier substrate; and a fixed platen disposed adjacent to the movable platen, for carrying the first divided area of the carrier substrate and the effective area of the flexible substrate.

11. The separating device as claimed in claim 10, further comprising: a rotating component connecting the fixed platen and the movable platen, for controlling the movable platen to rotate around the fixed platen, thereby raising the second divided area of the carrier substrate.

12. The separating device as claimed in claim 11, wherein the rotating component includes shafts or hinges.

13. The separating device as claimed in claim 11, further comprising: a control unit, for controlling a rotation rate and a rotation extent of the rotating component.

14. The separating device as claimed in claim 10, further comprising: a cutting component, for cutting the carrier substrate according to a spatial relationship between the effective area and the ineffective area of the flexible substrate, thereby forming the first divided area defined corresponding to the effective area and the second divided area defined corresponding to the ineffective area from the carrier substrate;

the cutting component is also used for, after the separated flexible substrate is removed from the carrier substrate, cutting off the ineffective area of the removed flexible substrate.

* * * * *